(12) United States Patent
Park et al.

(10) Patent No.: US 10,761,635 B2
(45) Date of Patent: Sep. 1, 2020

(54) TOUCH DISPLAY DEVICE, BACK LIGHT UNIT AND FLEXIBLE PRINTED CIRCUIT

(71) Applicant: LG DISPLAY CO., LTD., Seoul (KR)

(72) Inventors: Kyungjae Park, Incheon (KR); TaeWoo Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 123 days.

(21) Appl. No.: 15/637,715

(22) Filed: Jun. 29, 2017

(65) Prior Publication Data

US 2018/0004334 A1 Jan. 4, 2018

(30) Foreign Application Priority Data

Jun. 30, 2016 (KR) .................... 10-2016-0083118

(51) Int. Cl.
*G06F 3/041* (2006.01)
*H05K 1/14* (2006.01)
*H05K 1/11* (2006.01)
*H05K 3/36* (2006.01)
*G06F 3/044* (2006.01)

(52) U.S. Cl.
CPC .......... *G06F 3/0414* (2013.01); *G06F 3/044* (2013.01); *H05K 1/118* (2013.01); *H05K 1/147* (2013.01); *H05K 3/361* (2013.01); *G06F 2203/04105* (2013.01); *H05K 2201/05* (2013.01); *H05K 2201/056* (2013.01); *H05K 2201/10106* (2013.01); *H05K 2201/10128* (2013.01); *H05K 2201/10136* (2013.01)

(58) Field of Classification Search
CPC .... G06F 3/0414; G06F 3/0416; G06F 3/0412; G06F 3/044

USPC ......................................................... 345/173
See application file for complete search history.

(56) References Cited

U.S. PATENT DOCUMENTS

| 9,131,037 B2* | 9/2015 | Corbin ................ H05K 9/006 |
| 9,454,025 B2* | 9/2016 | Zhong ............... G02F 1/13306 |
| 2011/0227848 A1* | 9/2011 | Furusawa ............. G06F 1/1626 345/173 |
| 2013/0277095 A1* | 10/2013 | Lin ...................... H05K 1/0277 174/254 |
| 2014/0204285 A1* | 7/2014 | Jang ...................... G06F 3/044 349/12 |

(Continued)

FOREIGN PATENT DOCUMENTS

| CN | 105389046 A | 3/2016 |
| CN | 105511701 A | 4/2016 |
| CN | 105632344 A | 6/2016 |

*Primary Examiner* — Fred Tzeng
(74) *Attorney, Agent, or Firm* — Birch, Stewart, Kolasch & Birch, LLP

(57) ABSTRACT

The present invention relates to a touch display device, a back light unit, and a flexible printed circuit. The present invention improves a structure of a flexible printed circuit that outputs a force driving signal so as to be suitable for a structure included in the touch display device. Thus, an example of the present invention is a touch display device including a compact signal transmission path. Further, a force electrode and the flexible printed circuit are configured as one body to transmit a force driving signal to the force electrode through a signal line in the flexible printed circuit. Thus, an example of the present invention is a touch display device that can stably apply a force driving signal through a compact signal transmission path.

17 Claims, 12 Drawing Sheets

(56) References Cited

U.S. PATENT DOCUMENTS

| | | | |
|---|---|---|---|
| 2014/0253501 A1* | 9/2014 | Noguchi | G02F 1/13338 |
| | | | 345/174 |
| 2015/0162388 A1* | 6/2015 | Kim | H01L 27/323 |
| | | | 257/40 |
| 2016/0034087 A1* | 2/2016 | Kim | G06F 3/044 |
| | | | 345/173 |
| 2016/0147345 A1* | 5/2016 | Lee | G06F 3/0412 |
| | | | 345/173 |
| 2016/0320543 A1* | 11/2016 | Schlaupitz | G02B 6/0035 |
| 2017/0060326 A1* | 3/2017 | Kim | G06F 3/0416 |
| 2017/0090651 A1* | 3/2017 | Kang | G06F 3/0416 |
| 2017/0194411 A1* | 7/2017 | Park | H01L 51/5253 |

* cited by examiner

TOUCH DISPLAY DEVICE, BACK LIGHT UNIT AND FLEXIBLE PRINTED CIRCUIT

CROSS-REFERENCE TO RELATED APPLICATIONS

This application claims priority from Korean Patent Application No. 10-2016-0083118, filed on Jun. 30, 2016, which is hereby incorporated by reference for all purposes as if fully set forth herein.

BACKGROUND OF THE INVENTION

Field of the Invention

The present invention relates to a touch display device, and a back light unit and a flexible printed circuit included in the touch display device.

Description of the Related Art

With the progress of information-oriented society, various demands for display devices for displaying an image are increasing, and various types of display devices such as a liquid crystal display device, a plasma display panel device, and an organic light emitting display device have been used.

Such display devices provide a function of recognizing a user's touch on a display panel and operating a display device on the basis of the recognized touch in order to improve the user's convenience and provide various functions to the user.

Such display devices capable of performing a touch input process are being developed so as to provide more functions, and users' demands for the touch input process are also getting versatile.

However, a general touch input process includes sensing only a user's touch position (touch coordinates) and performing a relevant input process on the basis of the sensed touch position, and, thus, has limits in providing various functions and satisfying the users' demands.

Therefore, a display device capable of processing a user's touch input on a display panel in various ways has been demanded. Also, a configuration or structure of a display device for processing various touch inputs needs to be improved.

In the case where the configuration or structure of the general display device is improved to add a touch input processing function, it is very important to improve the display device so that the display device can provide various touch input processing functions without affecting the structure or function of the general display device.

SUMMARY OF THE INVENTION

An aspect of the present invention provides a display device capable of sensing a user's touch force on a display panel.

Another aspect of the present invention provides a touch display device in which a path for a force driving signal for sensing a user's touch force is compactly configured.

Yet another aspect of the present invention provides a touch display device that enables a force driving signal for sensing a user's touch force to be stably applied.

According to an aspect of the present invention, there is provided a touch display device including a plurality of touch electrodes E1 embedded in a display panel and a force electrode E2 disposed as being spaced from the plurality of touch electrodes.

A gap structure unit that enables a gap to be formed between the plurality of touch electrodes E1 and the force electrode E2 may be disposed under the display panel in which the plurality of touch electrodes E1 is embedded.

The gap structure unit may be a lower structure disposed under the display panel, and may be, for example, a guide panel for a back light unit.

The touch display device according to an embodiment of the present invention may include a flexible printed circuit including a first part disposed under the lower structure and a second part extended from the first part while covering a lateral surface of the lower structure and disposed in a partial area between the display panel and the lower structure.

The flexible printed circuit may further include an electrode unit disposed under the lower structure, a main circuit unit disposed in a partial area between the display panel and the lower structure, and a connection unit folded in a direction while connecting the electrode unit and the main circuit unit.

The electrode unit of the flexible printed circuit is disposed under the lower structure and may be disposed in an area corresponding to the display panel in which the plurality of touch electrodes E1 is embedded.

The connection unit of the flexible printed circuit connects the electrode unit and the main circuit unit while covering a lateral surface of the lower structure and a plurality of connection units may connect the electrode unit and the main circuit unit.

The flexible printed circuit may include a signal input unit extended toward a lateral surface of the electrode unit different from the lateral surface where the connection unit is located.

Otherwise, the signal input unit may be connected to a side of the main circuit unit.

In this case, the signal input unit may be connected to a lateral surface of the main circuit unit opposite to a lateral surface where the main circuit unit and the electrode unit are connected.

Through the signal input unit, a force driving signal may be applied to the electrode unit during a period where the touch display device is driven for sensing a force.

That is, the electrode unit of the flexible printed circuit may correspond to the force electrode E2.

Meanwhile, a metal plate may be located under the flexible printed circuit, and the signal input unit of the flexible printed circuit may be extended to be disposed under the metal plate while covering a lateral surface of the metal plate.

An insulating layer may be located between the flexible printed circuit and the metal plate. In this case, a ground voltage may be applied to the metal plate.

According to another aspect of the present invention, there is provided a back light unit including a light source, a light guide plate configured to uniformly transfer a light incident from the light source to a display panel, a guide panel having a rectangular frame shape and configured to accommodate the light source and the light guide plate therein, and a flexible printed circuit including a first part disposed under the light source and the light guide plate and a second part extended from the first part to be disposed in a partial area under the display panel while covering a lateral surface of the guide panel.

According to yet another aspect of the present invention, there is provided a flexible printed circuit including an electrode unit, a main circuit unit located on a side of the electrode unit, a connection unit folded in a direction while connecting the electrode unit and the main circuit unit, and a signal input unit connected to the other side of the electrode unit or to the main circuit unit.

In the flexible printed circuit, the signal input unit may be extended from the other side of the electrode unit and folded in a direction.

In this case, the connection unit may be folded in a direction toward an upper surface of the electrode unit and the signal input unit may be folded in a direction toward a lower surface of the electrode unit.

According to the present embodiments described above, it is possible to provide a touch display device capable of sensing a user's touch force as well as the user's touch position (e.g., coordinates).

According to the present embodiments described above, a flexible printed circuit included in the touch display device is extended to be disposed in an area corresponding to a plurality of touch electrode. Thus, the flexible printed circuit can be used as a force electrode.

According to the present embodiments described above, since the flexible printed circuit is used as a force electrode, a path through which a force driving signal is applied can be compactly configured.

According to the present embodiments described above, since the flexible printed circuit is used as a force electrode, the force driving signal can be stably applied during a force driving period.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
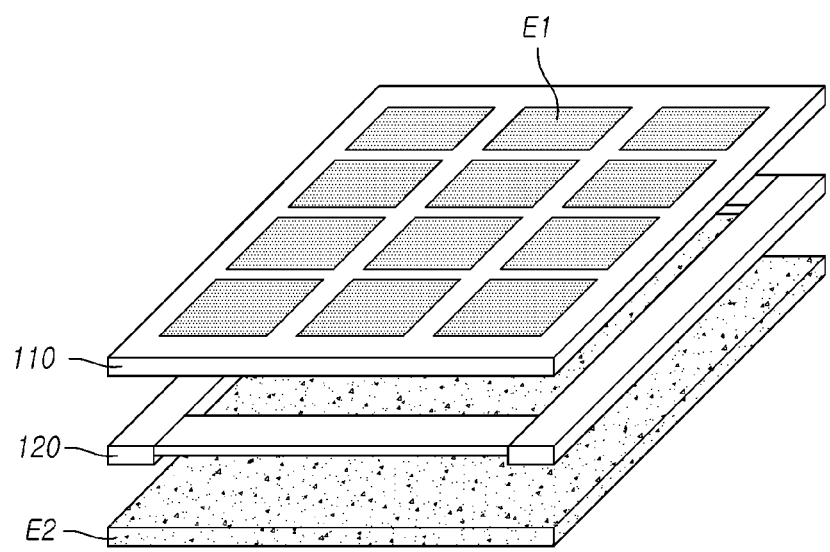
FIG. 1 is a diagram illustrating a schematic configuration of a touch display device according to the present embodiments.

Hereinafter, some embodiments of the present invention will be described in detail with reference to the accompanying drawings. When reference numerals refer to components of each drawing, although the same components are illustrated in different drawings, the same components are referred to by the same reference numerals as possible. Further, if it is considered that description of related known configuration or function may cloud the gist of the present invention, the description thereof will be omitted or may be brief.

Further, in describing components of the present invention, terms such as first, second, A, B, (a), (b), etc. can be used. These terms are used only to differentiate the components from other components. Therefore, the nature, order, sequence, or number of the corresponding components is not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

FIG. 1 is a diagram illustrating a schematic configuration of a touch display device 100 according to the embodiments of the present invention. All the components of the touch display device according to all embodiments of the present invention are operatively coupled and configured.

Referring to FIG. 1, the touch display device 100 according to the present embodiment (s) includes a display panel 110 in which a plurality of first electrodes E1 is embedded, a gap structure unit 120 located under the display panel 110, and a second electrode E2 located under the gap structure unit 120 and disposed as being spaced from the plurality of first electrodes E1 embedded in the display panel 110.

The plurality of first electrodes E1 is embedded in the display panel 110 as being separated from each other with a predetermined size.

During a period where the display panel 110 operates in display mode, a display driving signal (e.g., voltage) is applied to the plurality of first electrodes E1.

During a period where the display panel 110 operates in a touch mode, a touch driving signal (e.g., voltage) is applied to the plurality of first electrodes E1.

Since the plurality of first electrodes E1 is disposed as being separated from each other in the display panel 110, if there is a user's touch in a state where the touch driving signal is applied to the plurality of first electrodes E1, it is possible to sense a touch or non-touch and a touch position (coordinates).

That is, the plurality of first electrodes E1 functions as electrodes for display driving and electrodes for touch driving. Hereinafter, the plurality of first electrodes E1 will also be referred to as "touch electrodes".

The gap structure unit 120 may be disposed under the display panel 110.

The gap structure unit 120 enables a gap to be formed between the plurality of first electrodes E1 embedded in the display panel 110 and the second electrode E2.

The gap structure unit 120 may be a component separately added to maintain the gap between the plurality of first electrodes E1 and the second electrode E2, or may be a component already included in the touch display device 100.

For example, a lower structure disposed under the display panel 110 may correspond to the gap structure unit 120, and the lower structure may be a backlight unit in the case where the touch display device 100 is a liquid crystal display device.

In the back light unit, a guide panel configured to accommodate a light source and a light guide plate therein may enable a gap to be formed between the plurality of first electrodes E1 and the second electrode E2.

The second electrode E2 is disposed as being spaced from the plurality of first electrodes E1 embedded in the display panel 110 and disposed in an area corresponding to the plurality of first electrodes E1.

The second electrode E2 is applied with a force driving signal (e.g., voltage) for sensing the user's touch force during a period where the touch display device 100 operates in a touch mode.

That is, the second electrode E2 is an electrode for sensing the user's touch force. Hereinafter, the second electrode E2 will also be referred to as "force electrode".

A touch mode period may be time-divided into a touch driving period and a force driving period, and during the force driving period, a force driving signal may be applied to the second electrode E2.

Otherwise, during the touch mode period, a touch driving signal may be applied to the plurality of first electrodes E1 and a force driving signal may be applied to the second electrode E2 so as to simultaneously sense a touch position (e.g., coordinates) and a touch force.

If a vertical load of the user is applied to the display panel 110 in a state where a force driving signal is applied to the second electrode E2, a size of the gap between the plurality of first electrodes E1 and the second electrode is changed.

Due to a change in size of the gap between the plurality of first electrodes E1 and the second electrode, a capacitance between the plurality of first electrodes E1 and the second electrode is changed.

Therefore, it is possible to sense a touch force of the user by sensing a change in capacitance between the plurality of first electrodes E1 and the second electrode.

As described above, according to the present embodiments, the second electrode E2 maintaining the gap with the plurality of first electrodes E1 is disposed, and, thus, the user's touch position (coordinates) and touch force can be sensed.

Herein, the second electrode E2 needs to be disposed as being spaced from the display panel 110 in which the plurality of first electrodes E1 is embedded. Therefore, a path for transmitting a force driving signal to the second electrode E2 is needed.

The present embodiments provide the touch display device 100 in which a path for transmitting a force driving signal to the second electrode E2 is compactly configured.

Further, the present embodiments provide the touch display device 100 having a structure that enables a force driving signal to be stably transmitted to the second electrode E2 during a force driving period.

Figure 2:
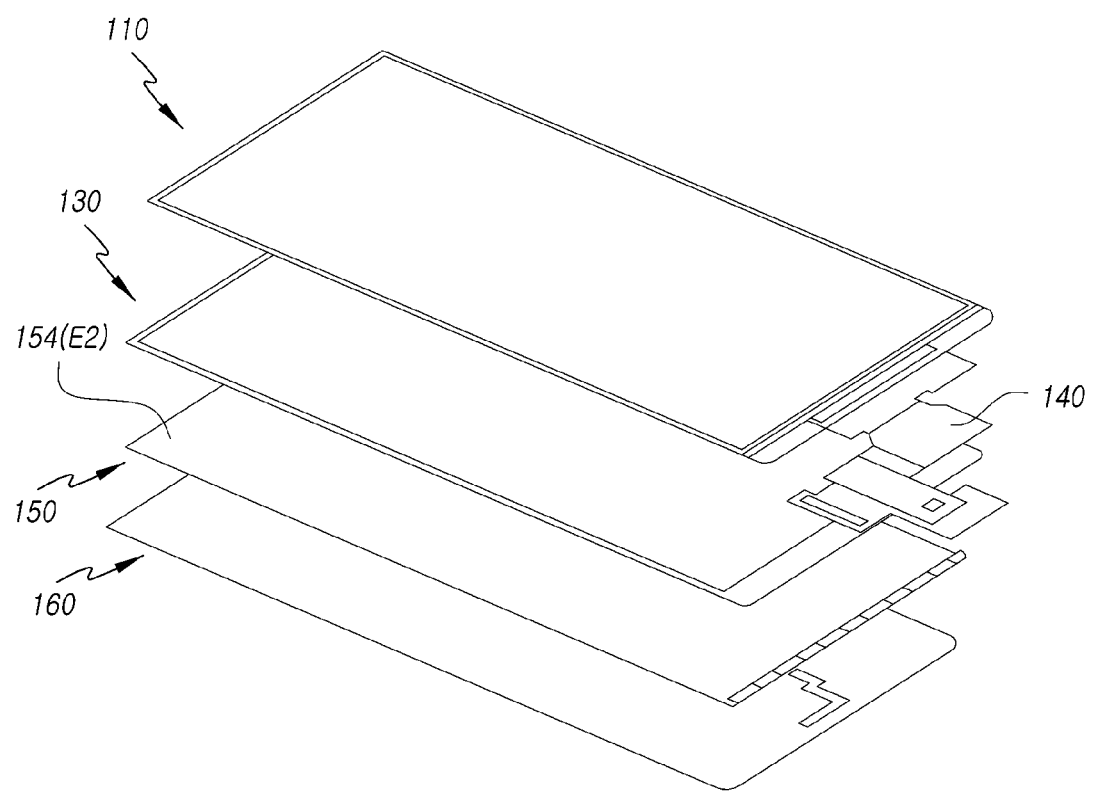
FIG. 2 is a diagram illustrating a configuration of a touch display device according to a first embodiment.

FIG. 2 illustrates a configuration of the touch display device 100 according to a first exemplary embodiment.

Referring to FIG. 2, the touch display device 100 according to the first embodiment includes the display panel 110 in which the plurality of first electrodes E1 is embedded, a lower structure 130 located under the display panel 110, a first flexible printed circuit 140 electrically connected to the plurality of first electrodes E1, a second flexible printed circuit 150 electrically connected to the first flexible printed circuit 140, and a metal plate 160 located under the second flexible printed circuit 150.

The first flexible printed circuit 140 outputs a display driving signal or a touch driving signal to the plurality of first electrodes E1 embedded in the display panel 110.

For example, the first flexible printed circuit may be a panel flexible printed circuit (Panel FPCB).

Further, the second flexible printed circuit 150 electrically connected to the first flexible printed circuit 140 includes the second electrode E2 to which a force driving signal is applied.

The force driving signal may be transmitted to the second flexible printed circuit 150 through the first flexible printed circuit 140 and then output to the second electrode E2.

In the case where the touch display device 100 is a liquid crystal display device, the second flexible printed circuit 150 may be a LED flexible printed circuit (LED FPCB).

In this case, the second flexible printed circuit 150 may be integrated with the second electrode E2 located in under the lower structure 130.

Figure 3:
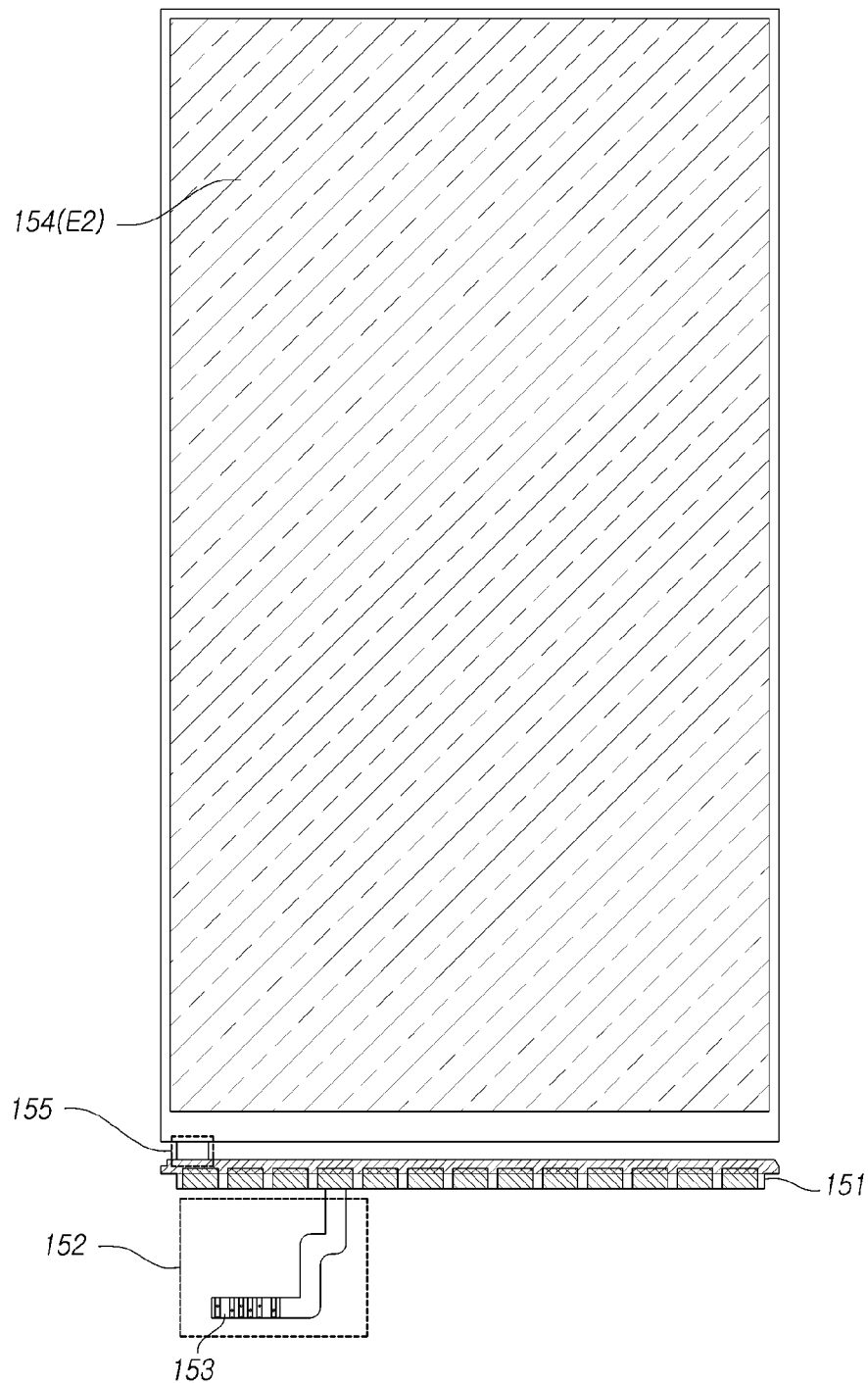
FIG. 3 and FIG. 4 are diagrams illustrating a structure of a flexible printed circuit included in the touch display device according to the first embodiment.
Figure 4:
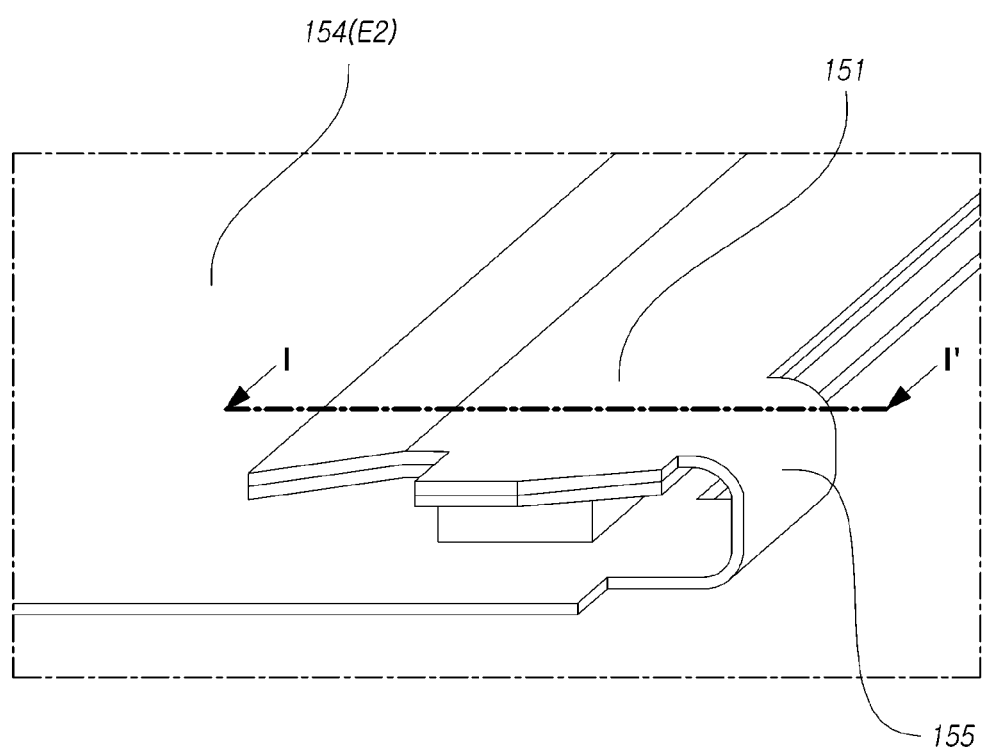

FIG. 3 and FIG. 4 illustrate a structure of the flexible printed circuit 150 in the touch display device 100 according to the first embodiment.

Referring to FIG. 3, the second flexible printed circuit 150 includes a main circuit unit 151, a signal input unit 152 to which a force driving signal is input, an electrode unit 154 including the second electrode E2, and a connection unit 155 connecting the main circuit unit 151 and the electrode unit 154.

For example, the second electrode E2 in the electrode unit 154 and signal lines in the main circuit unit 151 and the signal input unit 152 may be formed of the same material. Further, all of the insulation layers located in the electrode unit 154, the main circuit unit 151, the signal input unit 152, and the connection unit 155 may be formed of the same material.

The electrode unit 154 is disposed under the lower structure, and may be disposed in an area corresponding to the plurality of first electrodes E1 embedded in the display panel 110.

The electrode unit 154 may be electrically connected to the main circuit unit 151 through the connection unit 155. Since the main circuit unit 151 is disposed in an area corresponding to a light source unit of the display device, the main circuit unit 151 may be connected to a lateral surface of the electrode unit 154, i.e., a lateral surface in a direction toward the light source unit of the display device, through the connection unit 155.

The main circuit unit 151 is disposed in a partial area between the display panel 110 and the lower structure 130, and the connection unit 155 extended from a lateral portion of the main circuit unit 151 is connected to the electrode unit 154 while covering a lateral surface of the lower structure 130.

The signal input unit 152 is connected to a side of the main circuit unit 151. For example, the signal input unit 152 may be connected to the other lateral portion of the main circuit unit 151 opposite to a lateral portion from which the connection unit 155 is extended.

When the main circuit unit 151 is located on the lower structure 130 by folding the connection unit 155, the signal input unit 152 is disposed in an inward direction of the electrode unit 154, i.e., a direction in which the second electrode E2 is located. The signal input unit 152 needs to be connected to the first flexible printed circuit 140 that outputs a force driving signal. Therefore, the signal input unit 152 located in the inward direction of the electrode unit 154 may be folded in an outward direction so as to be exposed to the outside.

If a force driving signal is input through a signal input terminal 153 of the signal input unit 152 during a force driving period, the force driving signal is transmitted to the second electrode E2 in the electrode unit 154 through a signal line in the second flexible printed circuit 150.

Further, if a panel driving signal is input through the signal input terminal 153 of the signal input unit 152, the panel driving signal is transmitted to the main circuit unit 151 through another signal line in the second flexible printed circuit 150.

That is, both the force driving signal and the panel driving signal can be transmitted through the second flexible printed circuit 150, and, thus, a structure can be simplified and a compact and stable transmission path for a force driving signal can be provided.

Also, the force driving signal is directly transmitted to the second electrode E2 without a signal transmission medium such as a conductive tape, and, thus, it is possible to suppress a signal cut-off caused by a bad contact which may occur in the case of connection through the medium.

The following Table 1 shows an example of the composition of each layer in the second flexible printed circuit 150.

TABLE 1

| Layer composition | Classification | Electrode unit 154 | Main circuit unit 151 | Signal input unit 152 and Connection unit 155 | Signal input terminal 153 |
|---|---|---|---|---|---|
| Cover layer | Polyimide | X | ○ | X | X |
| | Polyimide | X | ○ | X | X |
| | Adhesive | X | ○ | X | X |
| Flexible copper clad laminate (FCCL) | Copper | X | ○ | X | ○ |
| | Polyimide | ○ | ○ | ○ | ○ |
| | Copper | ○ | ○ | ○ | ○ |
| Cover layer | Adhesive | ○ | ○ | ○ | ○ |
| | Polyimide | ○ | ○ | ○ | ○ |

The electrode unit 154, the main circuit unit 151, the signal input unit 152, and the connection unit 155 are configured as one body. Therefore, in a state where all of the layers constituting the second flexible printed circuit 150 are included, the second flexible printed circuit 150 can be manufactured by removing some layers except necessary layers for each configuration.

For example, the electrode unit 154 needs to include only layers required to constitute the second electrode E2, and, thus, layers except a lower copper layer and an insulating layer (polyimide) may be removed from a flexible copper clad laminate (FCCL).

The signal input terminal 153 includes both an upper copper layer and the lower copper layer of the flexible copper clad laminate (FCCL) so as to receive a force driving signal.

FIG. 4 illustrates a larger image of a portion where the connection unit 155 of the second flexible printed circuit 150 is located.

Referring to FIG. 4, the folded connection unit 155 is located on a lateral portion of the main circuit unit 151.

The connection unit 155 may have a structure covering a lateral surface of the lower structure 130 located under the main circuit unit 151. Further, the connection unit 155 is directly connected to the electrode unit 154 disposed under the lower structure 130. In other words, it can be seen that the main circuit unit 151 is extended so as to constitute the electrode unit 154 disposed under the lower structure 140. In the above-described structure, the main circuit unit 151 corresponding to the LED flexible printed circuit can be integrated with the electrode unit 154 to which a force driving signal is transmitted. Thus, it is possible to design a simple and compact structure.

Further, since the force driving signal input through the signal input unit 152 is directly transmitted to the second electrode E2 in the electrode unit 154 through the main circuit unit 151 and the connection unit 155, it is possible to stably transmit a signal and also possible to improve a force sensing function.

Figure 5:
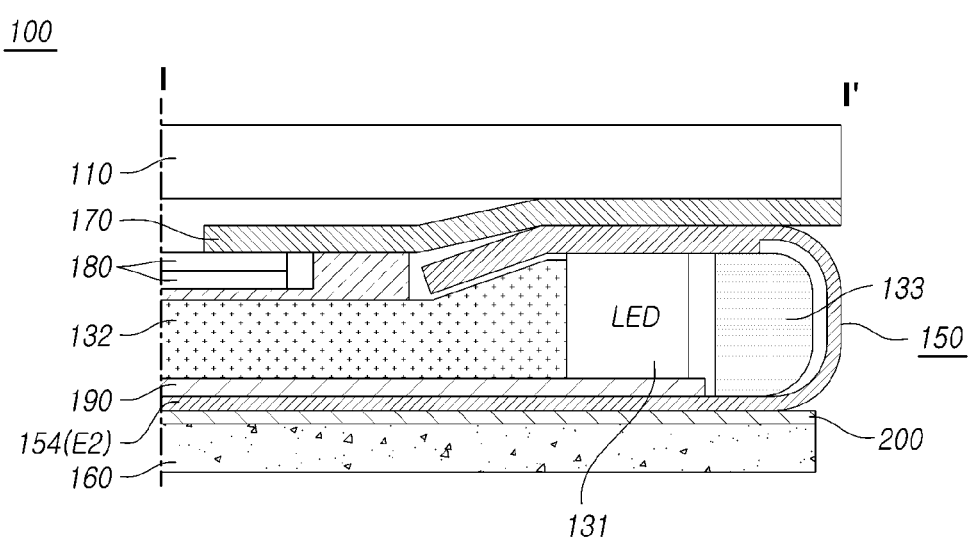
FIG. 5 is a cross-sectional view of the touch display device according to the first embodiment.

FIG. 5 shows a cross-sectional view taken along a line I-I' of FIG. 4 and illustrates the case where the touch display device 100 is a liquid crystal display device. FIG. 5 also shows a cross-sectional view of a light entrance portion.

Referring to FIG. 5, the display device 100 includes the display panel 110 in which the plurality of first electrodes E1 is embedded and a back light unit corresponding to the lower structure 130 located under the display panel 110.

A light shielding tape 170 may be disposed between the display panel 110 and the back light unit.

The back light unit may include a light source 131, a light guide plate 132 configured to transfer a light incident from the light source 131 to the display panel 110, and a guide panel 133 configured to accommodate the light source 131 and the light guide plate 132 therein.

Further, the back light unit may include an optical sheet 180 disposed on an upper surface of the light guide plate 132 and a reflecting plate 190 disposed on lower surfaces of the light source 131 and the light guide plate 132.

The second flexible printed circuit 150 is disposed between the light shielding tape 170 and the back light unit and extended toward a lower side of the guide panel 133 while covering a lateral surface of the guide panel 133 of the back light unit.

The extended second flexible printed circuit 150 constitutes the electrode unit 154 as being disposed under the back light unit.

The force driving signal input through the signal input unit 152 of the second flexible printed circuit 150 is transmitted to the second electrode E2 in the electrode unit 154 corresponding to a force electrode through the connection unit 155 covering a lateral surface of the back light unit.

The second electrode E2 in the electrode unit 154 corresponding to a force electrode is connected through a signal line in the signal input unit 152 to which the force driving signal is input. Thus, a compact signal transmission path for stably transmitting a force driving signal can be provided.

The metal plate 160 may be disposed under the second flexible printed circuit 150 including the electrode unit 154.

The metal plate 160 is disposed in an area corresponding to the electrode unit 154 of the second flexible printed circuit 150 so as to function to maintain the flatness.

Further, an insulating layer 200 may be disposed between the second flexible printed circuit 150 and the metal plate 160.

In this case, a ground signal (voltage) may be applied to the metal plate 160. Thus, the metal plate 160 may also function as a ground electrode.

Meanwhile, in the case of connection through the integrated second flexible printed circuit 150, a position of the signal input unit 152 which needs to be connected to the first flexible printed circuit 140 may make the assembly difficult.

For example, when the second flexible printed circuit 150 is assembled to the display device 100, the electrode unit 154, the main circuit unit 151, and the connection unit 155 are disposed on the same plane.

In the case where the lower structure 130 such as a back light unit is located on the electrode unit 154, the main circuit unit 151 is located on an upper surface of the lower structure 130 by folding the connection unit 155.

That is, the main circuit unit 151 moves as the connection unit 155 is folded during an assembly process, and, thus, the signal input unit 152 connected to the main circuit unit 151 is located within the display device 100. The signal input unit 152 needs to be exposed to the outside so as to be connected to the first flexible printed circuit 140, and, thus, the signal input unit 152 needs to be folded in a direction opposite to a folding direction of the connection unit 155, which may make the assembly difficult.

Further, during the assembly process as described above, the signal input unit 152 may be damaged, and, thus, a force driving signal may not be stably input.

The present embodiments provide a structure of the second flexible printed circuit 150 which can suppress damage to the signal input unit 152 in an integrated structure of the force electrode E2 and the second flexible printed circuit 150 and can be stably assembled.

Figure 6:
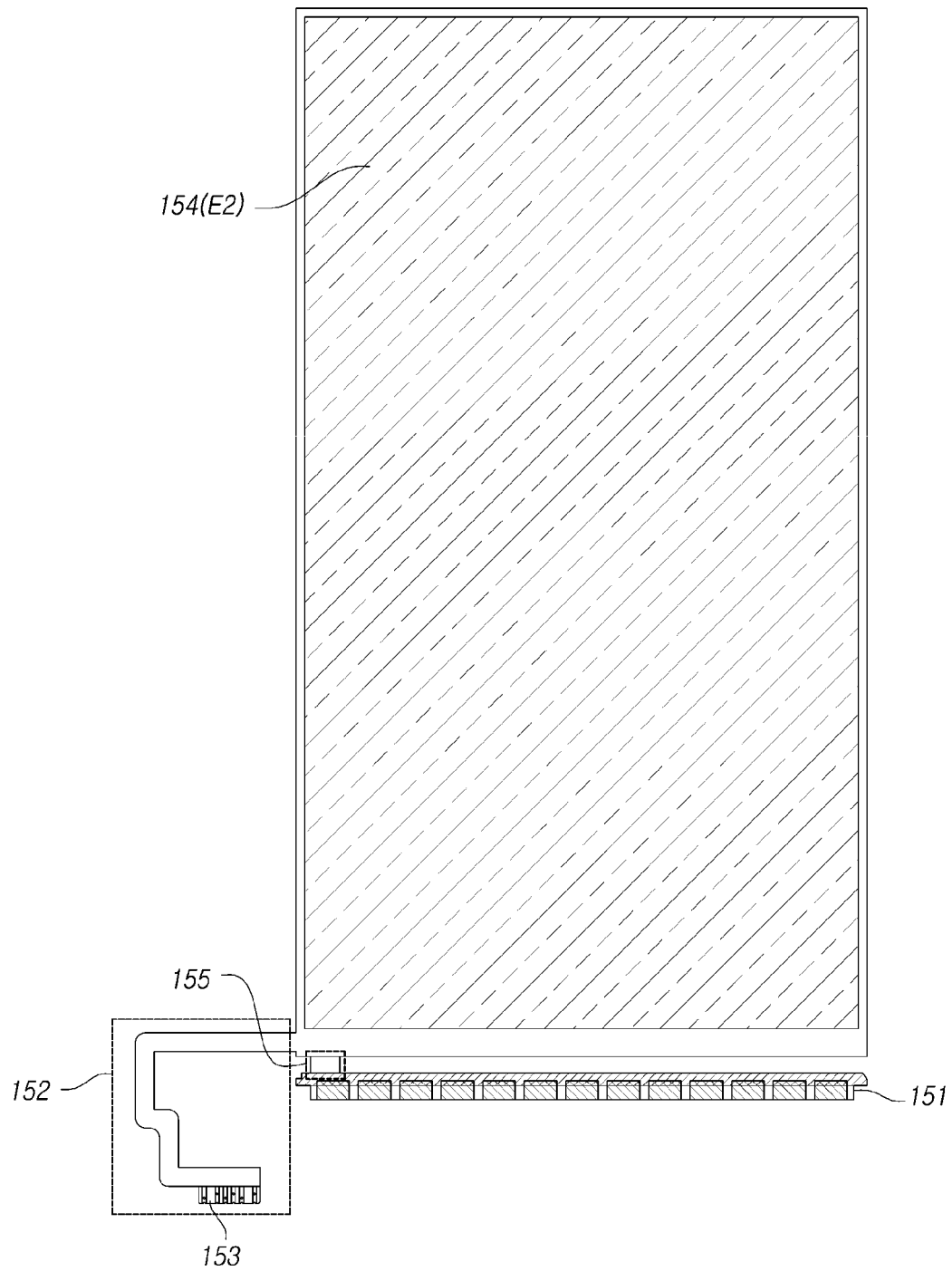
FIG. 6 and FIG. 7 are diagrams illustrating a structure of a flexible printed circuit included in a touch display device according to a second embodiment.
Figure 7:
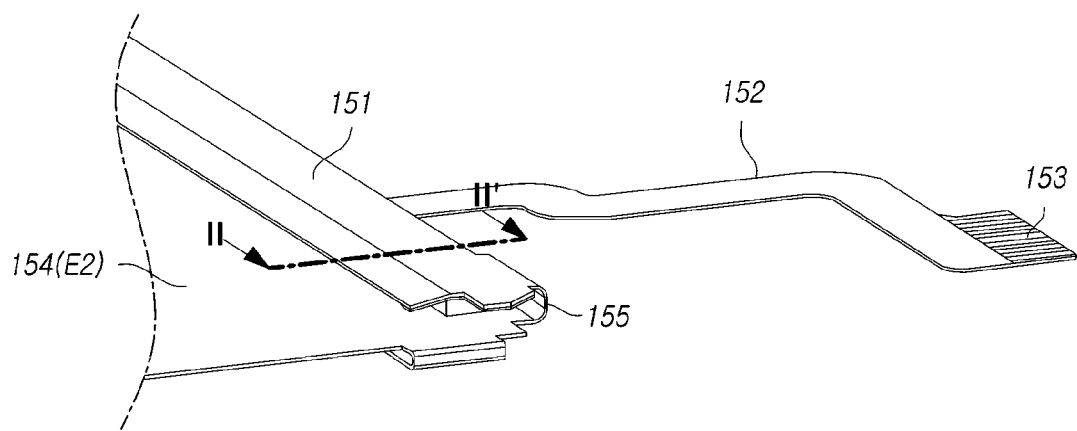

FIG. 6 and FIG. 7 illustrate a structure of the second flexible printed circuit 150 included in the touch display device 100 according to a second embodiment. An explanation of the same components described above with reference to FIG. 3 and FIG. 4 will be omitted or may be brief.

Referring to FIG. 6, the second flexible printed circuit 150 includes the main circuit unit 151, the signal input unit 152 to which a force driving signal is input, the electrode unit 154 including the second electrode E2, and the connection unit 155 connecting the main circuit unit 151 and the electrode unit 154.

For example, the second electrode E2 in the electrode unit 154 and signal lines in the main circuit unit 151 and the signal input unit 152 may be formed of the same material. Further, all of the insulation layers located in the electrode unit 154, the main circuit unit 151, the signal input unit 152, and the connection unit 155 may be formed of the same material.

In this case, the signal input unit 152 to which a force driving signal is input is connected to a side of the electrode unit 154.

That is, since the main circuit unit 151 and the signal input unit 152 are disposed at different positions, the main circuit unit 151 can be easily moved during an assembly process and damage to the signal input unit 152 which may occur during the assembly process can be suppressed.

Referring to FIG. 7, the main circuit unit 151 of the second flexible printed circuit 150 moves toward an upper side of the lower structure 130 as the connection unit 155 is folded. That is, the main circuit unit 151 is folded in a direction toward an upper surface of the electrode unit 154.

The signal input unit 152 connected to a side of the electrode unit 154 is folded separately from the connection unit 155. That is, the signal input unit 152 may be folded in a direction, and for example, the signal input unit 152 may be folded while covering a lateral surface of the metal plate 160 located under the electrode unit 154.

The signal input unit 152 may be folded while covering a lateral surface of the metal plate 160 and then located under the metal plate 160. The signal input terminal 153 may be protruded to the outside of the metal plate 160 so as to be electrically connected to the first flexible printed circuit 140.

Therefore, according to the present embodiments, both a force driving signal and a panel driving signal can be transmitted through the second flexible printed circuit 150, and, thus, a structure can be simplified and a compact and stable transmission path for a force driving signal can be provided.

Also, the force driving signal is directly transmitted to the second electrode E2 without a signal transmission medium such as a conductive tape, and, thus, it is possible to suppress a signal cut-off caused by a bad contact which may occur in the case of connection through the medium.

Further, since the signal input unit 152 is directly connected to the electrode unit 154 and transmits a force driving signal thereto, the stability in transmission of a force driving signal can be further improved.

Furthermore, the connection unit 155 and the signal input unit 152 of the second flexible printed circuit 150 are folded so as to be suitable for a structure of a conventional display device. Thus, the modified structure of the second flexible printed circuit 150 can be applied as it is without modifying the structure of the conventional display device.

Figure 8:
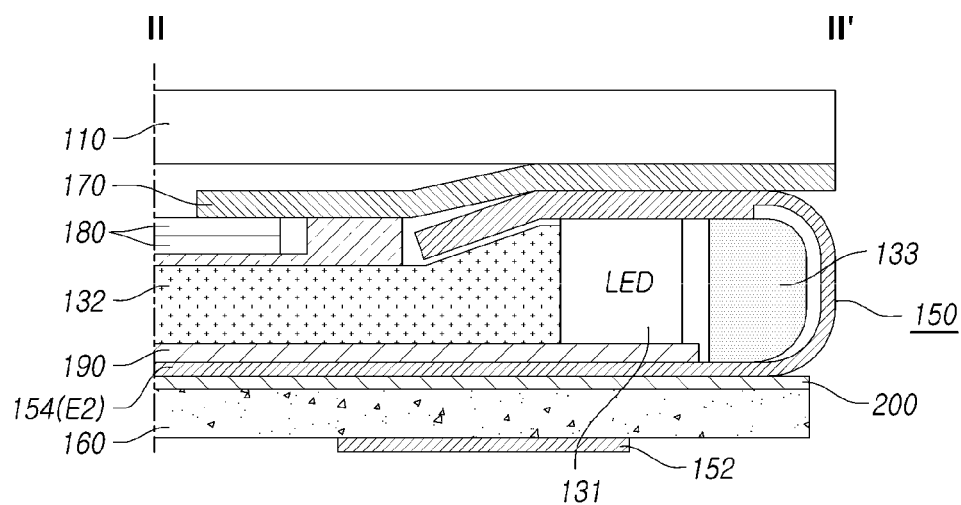
FIG. 8 is a cross-sectional view of the touch display device according to the second embodiment.

FIG. 8 shows a cross-sectional view taken along a line II-II' of FIG. 7 and illustrates the case where the touch display device 100 is a liquid crystal display device. FIG. 8 also shows a cross-sectional view of a light entrance portion.

Referring to FIG. 8, the second flexible printed circuit 150 is extended while covering a lateral surface of the guide panel 133 of the back light unit so as to constitute the electrode unit 154 located under the back light unit.

The signal input unit 152 connected to a side of the electrode unit 154 is located under the metal plate 160 while covering a lateral surface of the metal plate 160 located under the electrode unit 154.

The signal input terminal 153 of the signal input unit 152 may be protruded from a lower side to the outside of the metal plate 160 so as to be electrically connected to the first flexible printed circuit 140. Thus, a force driving signal can be input to the first flexible printed circuit 140.

Figure 9:
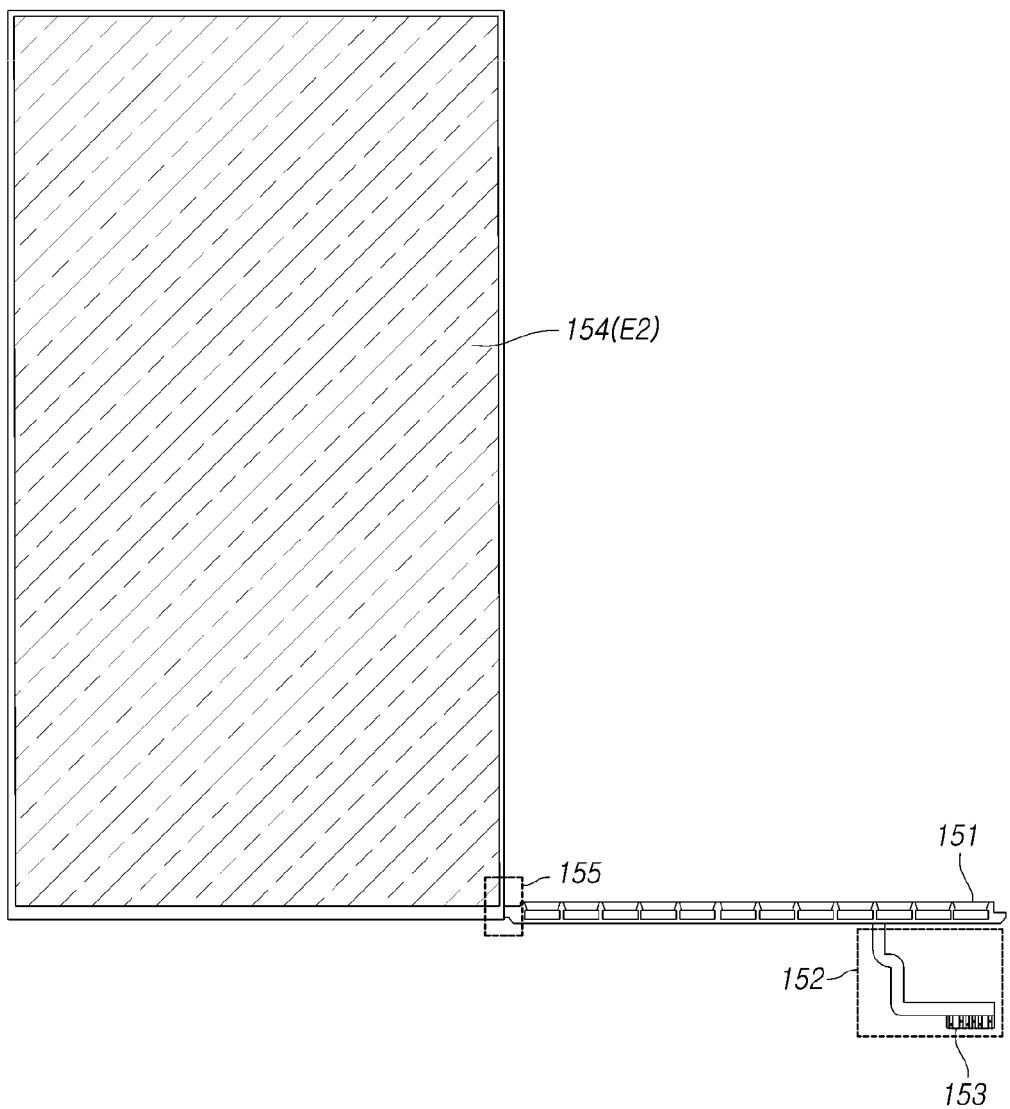
FIG. 9 is a diagram illustrating a structure of a flexible printed circuit included in a touch display device according to a third embodiment.

FIG. 9 illustrates a structure of the second flexible printed circuit 150 included in the touch display device 100 according to a third embodiment, and illustrates another structure of the second flexible printed circuit 150 which is designed to be easily assembled.

Referring to FIG. 9, the second flexible printed circuit 150 includes the main circuit unit 151, the signal input unit 152 to which a force driving signal is input, the electrode unit 154 including the second electrode E2, and the connection unit 155 connecting the main circuit unit 151 and the electrode unit 154.

For example, the second electrode E2 in the electrode unit 154 and signal lines in the main circuit unit 151 and the signal input unit 152 may be formed of the same material. Further, all of the insulation layers located in the electrode unit 154, the main circuit unit 151, the signal input unit 152, and the connection unit 155 may be formed of the same material.

The main circuit unit 151 and the electrode unit 154 are connected by the connection unit 155 located at a lateral surface on a side of the electrode unit 154, and the main circuit unit 151 is connected in a direction parallel to a side of the electrode unit 154.

Further, the signal input unit 152 is connected to a surface of the main circuit unit 151 different from a lateral surface connected to the connection unit 155.

As an example, a side of the electrode unit 154 connected to the connection unit 155 may be a short side of the electrode unit, and the main circuit unit 151 may be connected to a lateral surface on the short side of the electrode unit in a direction parallel to the short side of the electrode unit.

As another example, a side of the electrode unit 154 connected to the connection unit 155 may be a long side of the electrode unit, and the main circuit unit 151 may be connected to a lateral surface on the long side of the electrode unit in a direction parallel to the long side of the electrode unit.

In the case where the main circuit unit 151 is connected to a lateral surface on a side of the electrode unit 154 in parallel to the side of the electrode unit, the connection unit 155 is folded in the other direction of the side, i.e., a direction opposite to the lateral surface, and the main circuit unit 151 is located on an upper surface of the lower structure 130 located on an upper surface of the electrode unit 154.

When the main circuit unit 151 is moved to the upper surface of the lower structure 130, the signal input unit 152 is located as being protruded to the outside of the electrode unit 154.

Therefore, since the signal input unit 152 is located outside the electrode unit 154 during an assembly process for the second flexible printed circuit 150 including the electrode unit 154, the signal input unit 152 can be connected to the first flexible printed circuit 140 without separately folding the signal input unit 152.

Figure 10:
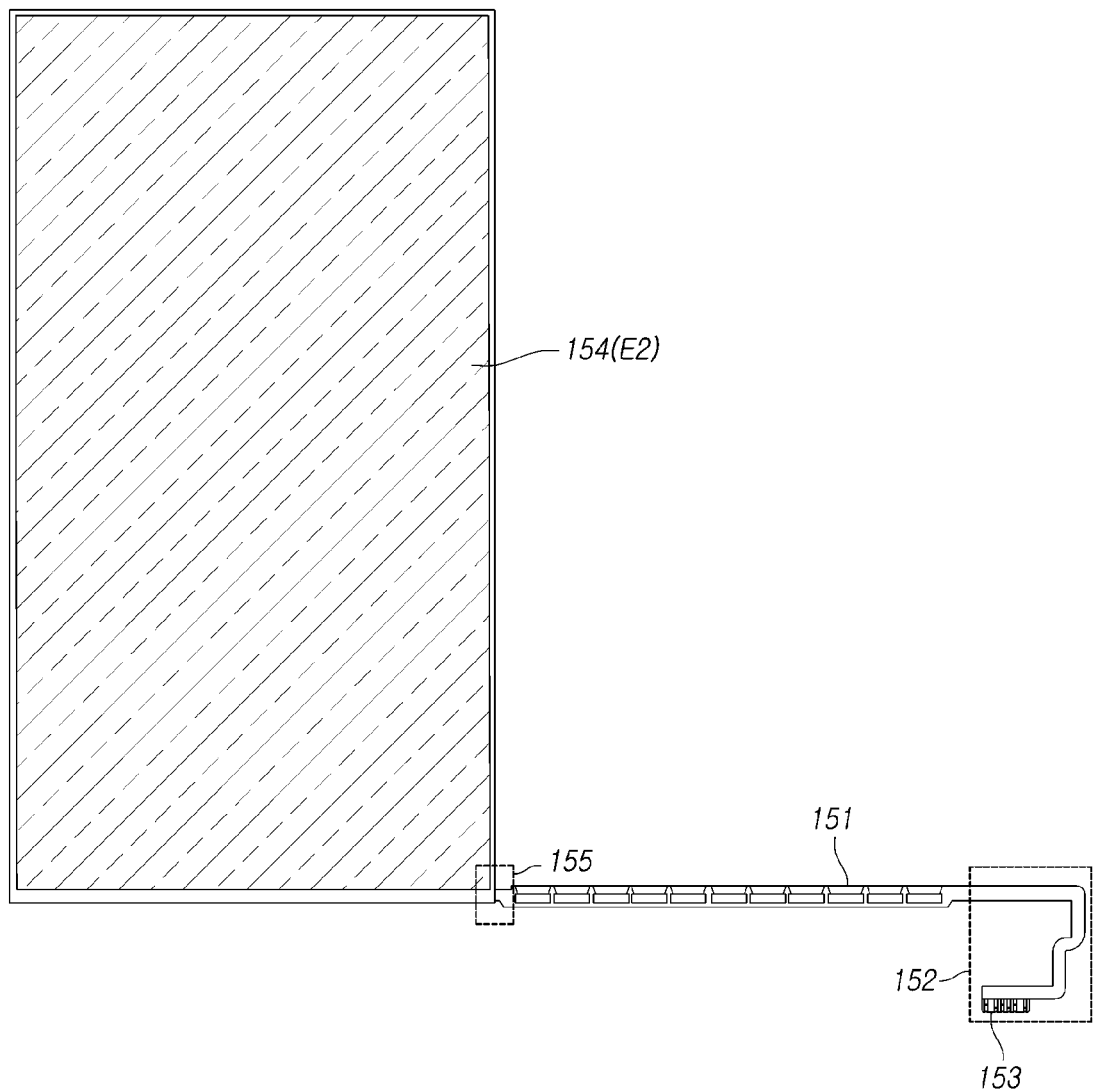
FIG. 10 is a diagram illustrating a structure of a flexible printed circuit included in a touch display device according to a fourth embodiment.

FIG. 10 illustrates a structure of the second flexible printed circuit 150 included in the touch display device 100 according to a fourth embodiment, and illustrates another structure of the third embodiment.

Referring to FIG. 10, the main circuit unit 151 is connected by the connection unit 155 located on a lateral surface of a side of the electrode unit 154, and the main circuit unit 151 is connected in a direction parallel to the side of the electrode unit 154.

Further, the signal input unit 152 is connected to a lateral surface of the main circuit unit 151 opposite to a lateral surface where the main circuit unit 151 and the connection unit 155 are connected.

As an example, a side of the electrode unit 154 connected to the connection unit 155 may be a short side of the electrode unit, and the main circuit unit 151 may be connected to a lateral surface on the short side of the electrode unit in a direction parallel to the short side of the electrode unit.

As another example, a side of the electrode unit 154 connected to the connection unit 155 may be a long side of the electrode unit, and the main circuit unit 151 may be connected to a lateral surface on the long side of the electrode unit in a direction parallel to the long side of the electrode unit.

In the case where the main circuit unit 151 is connected to a lateral surface on a side of the electrode unit 154 in parallel to the side of the electrode unit, the connection unit 155 is folded in the other direction of the side, i.e., a direction opposite to the lateral surface, and the main circuit unit 151 is located on an upper surface of the lower structure 130 located on an upper surface of the electrode unit 154.

The signal input unit 152 is located on an opposite lateral surface of the electrode unit 154 (the other lateral surface of the side) as the main circuit unit 151 is moved.

In this state, if the signal input unit 152 is folded, the signal input unit 152 moves toward a lower side of the metal plate 160 while covering a lateral surface of the lower structure 130 (a lateral surface corresponding to the other lateral surface on the side of the electrode unit) located on a lower surface of the main circuit unit 151 and a lateral surface of the metal plate 160 (a lateral surface corresponding to the other lateral surface on the side of the electrode unit) located under the electrode unit 154.

When the signal input unit 152 is folded and moved to a lower side of the metal plate 160, the signal input terminal 153 is located as being protruded toward the outside of the electrode unit 154.

Therefore, the signal input terminal 153 is located so as to be easily connected to the first flexible printed circuit 140.

According to the above-described second embodiment to the fourth embodiment, the second flexible printed circuit 150 including the electrode unit 154 is provided, and the signal input unit 152 is located as being protruded to the outside of the electrode unit 154 during the assembly process.

Thus, a structure that enables a force driving signal to be stably applied to the force electrode E2 is provided and a structure of the second flexible printed circuit 150 which can be easily assembled so as to be suitable for a structure of the touch display device 100 is provided.

Figure 11:
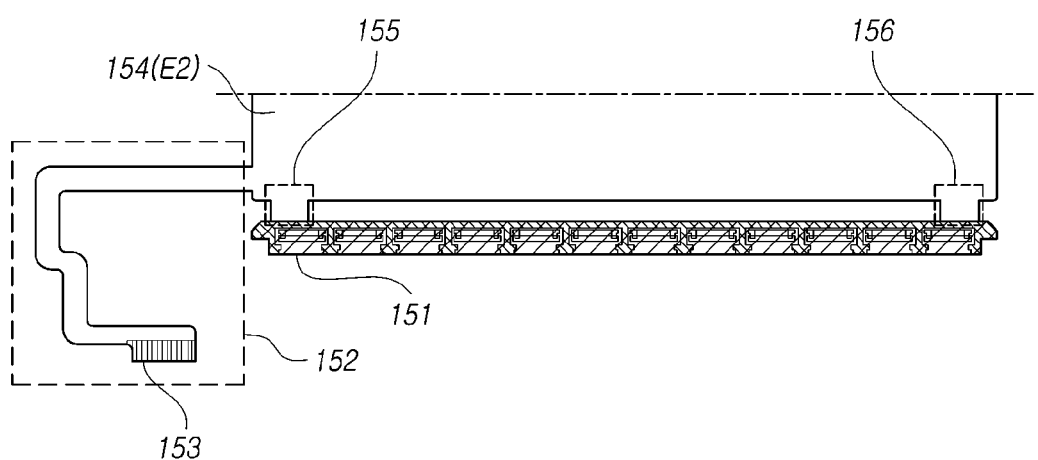
FIG. 11 is a diagram illustrating a structure of a flexible printed circuit included in a touch display device according to a fifth embodiment.

FIG. 11 illustrates a structure of the second flexible printed circuit 150 included in the touch display device 100 according to a fifth embodiment, and illustrates another structure applicable to the above-described first embodiment or second embodiment.

FIG. 11 shows a larger image of a portion of the second flexible printed circuit 150 where the electrode unit 154 and the main circuit unit 151 are connected.

The electrode unit 154 and the main circuit unit 151 are connected by the connection unit 155 and folded. Therefore, another connection unit 156 may be further included between the electrode unit 154 and the main circuit unit 151 in order to improve the assemblability.

For example, the connection units 155 and 156 connected to the electrode unit 154 at two points on aside of the main circuit unit 151 may be included, and the two connection units 155 and 156 may be folded, which enables stable and easy assembly.

FIG. 11 illustrates an example, and two or more connection units 155 may also be included between the electrode unit 154 and the main circuit unit 151.

Figure 12:
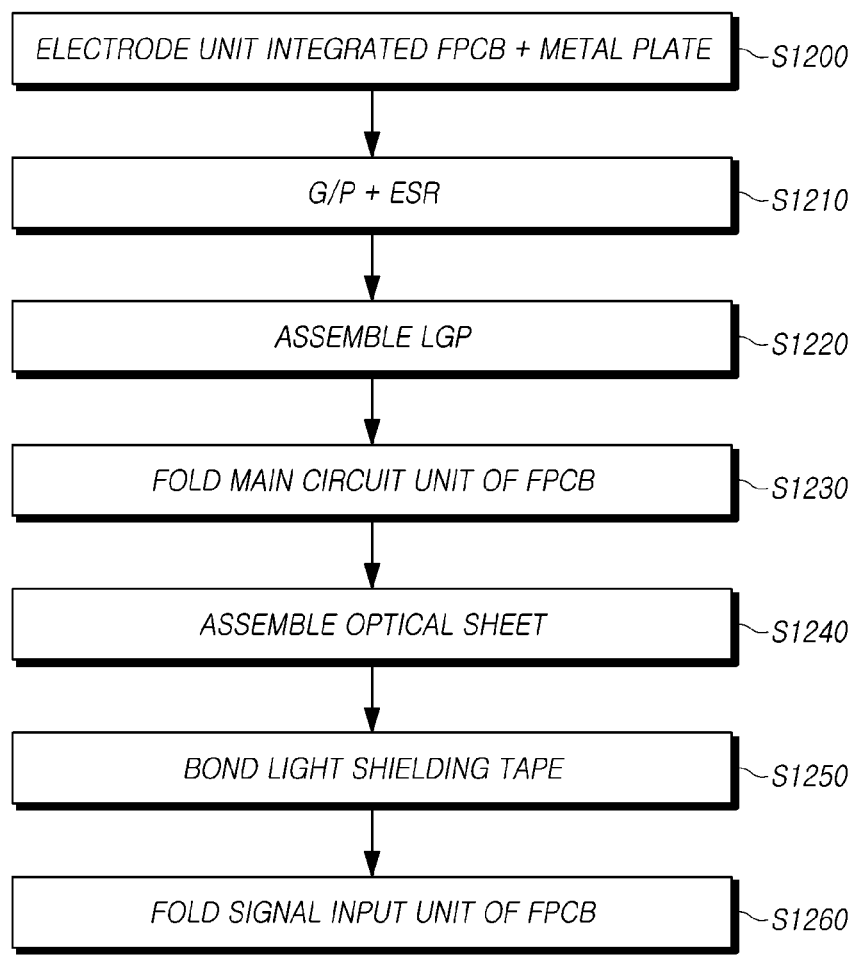
FIG. 12 is a diagram illustrating an assembly process for the touch display device according to the present embodiments.

FIG. 12 illustrates a process of assembling the lower structure 130 and the second flexible printed circuit 150 in the touch display device 100 according to the present embodiments, and illustrates the case where the lower structure 130 is a back light unit.

Referring to FIG. 12, the second flexible printed circuit 150 integrated with the electrode unit 154 is bonded to the metal plate 160 (S1200).

The guide panel 133 and the reflecting plate 190 of the back light unit are assembled to an upper surface of the second flexible printed circuit 150 (S1210), and the light guide plate 132, the light source 131, etc. are assembled (S1220).

Then, the main circuit unit 151 of the second flexible printed circuit 150 is folded (S1230), and, thus, the second flexible printed circuit 150 covers a lateral surface of the guide panel 133 and the main circuit unit 151 is located on an upper surface of the guide panel 133.

Then, the optical sheet 180 is assembled (S1240), and the light shielding tape 170 is assembled (S1250).

Finally, the signal input unit 152 of the second flexible printed circuit 150 is folded (S1260), and, thus, the signal input unit 152 is located under the metal plate 160 while covering a lateral surface of the metal plate 160.

According to the present embodiments, the second electrode E2 is disposed to be spaced from the plurality of first electrodes E1 embedded in the display panel 110. Thus, the user's touch force on the display panel 110 can be sensed.

Further, the second electrode E2 and the second flexible printed circuit 150 are configured as one body. Thus, a force driving signal can be stably transmitted through a compact signal transmission path.

Furthermore, each component of the second flexible printed circuit 150 configured as one body with the second electrode E2 is disposed at a position where the component can be easily assembled to the lower structure 130 and the like. Thus, the second flexible printed circuit 150 can be applied to a conventional display device as it is and thus can provide a touch force sensing function.

The above descriptions are provided only for illustration of the technical concept of the present invention, and it would be understood by those skilled in the art that various changes and modifications may be made without changing essential features of the present invention. Therefore, the embodiments of the present invention are provided for illustrative purposes only but not intended to limit the technical concept of the present invention. The scope of the technical concept of the present invention is not limited thereto. The protective scope of the present invention should be construed based on the following claims, and all the technical concepts in the equivalent scope thereof should be construed as falling within the scope of the present invention.

What is claimed is:

1. A touch display device comprising:
   a display panel in which a plurality of touch electrodes is embedded;
   a lower structure located under the display panel; and
   a flexible printed circuit including a first part and a second part extended from the first part, wherein the first part is located on an opposite area of a side where the display panel displays an image, and the first part is disposed under the lower structure,
   wherein the extended second part of the flexible printed circuit is disposed in a partial area between the display panel and the lower structure,
   wherein the first part of the flexible printed circuit includes a force electrode configured to sense a force of a touch input, and
   wherein the force electrode is separate from the display panel and the plurality of touch electrodes.

2. The touch display device according to claim 1, wherein the flexible printed circuit further includes:
   one or more connection units connecting the first part and the second part and extended while covering a lateral surface of the lower structure.

3. The touch display device according to claim 1, wherein the flexible printed circuit further includes:
   a signal input unit extended from the first part disposed under the lower structure toward another lateral surface of the lower structure.

4. The touch display device according to claim 1, wherein the flexible printed circuit is electrically connected to another flexible printed circuit electrically connected to the display panel.

5. The touch display device according to claim 1, further comprising:
   a metal plate located under the flexible printed circuit.

6. The touch display device according to claim 5, wherein the flexible printed circuit further includes:
   a signal input unit extended from the first part disposed under the lower structure toward another lateral surface of the lower structure and extended to be disposed under the metal plate while covering a lateral surface of the metal plate.

7. The touch display device according to claim 5, wherein the flexible printed circuit further includes:
   a signal input unit extended from a side of the second part disposed in the partial area between the display panel and the lower structure and extended to be disposed under the metal plate while covering a lateral surface of the lower structure and a lateral surface of the metal plate.

8. The touch display device according to claim 1, wherein the first part of the flexible printed circuit includes:
   an electrode layer disposed in an area corresponding to the plurality of touch electrodes; and
   an insulating layer located on the electrode layer.

9. The touch display device according to claim 1, wherein a force driving signal is applied through the flexible printed circuit during a force driving period.

10. A back light unit comprising:
    a light source;
    a light guide plate configured to uniformly transfer a light incident from the light source to a display panel;
    a guide panel having a rectangular frame shape and configured to accommodate the light source and the light guide plate therein; and
    a flexible printed circuit including a first part and a second part extended from the first part,
    wherein the first part of the flexible printed circuit is disposed on an opposite area of a side where the light guide plate transfers the light to the display panel, and the second part of the flexible printed circuit is disposed in a partial area under the display panel while covering a lateral surface of the guide panel, and
    wherein the first part of the flexible printed circuit includes a force electrode configured to sense a force of a touch input.

11. The back light unit according to claim 10, further comprising:
    a metal plate located under the first part of the flexible printed circuit.

12. The back light unit according to claim 11, wherein the flexible printed circuit further includes:
    a signal input unit extended from the first part to be disposed under the metal plate while covering the metal plate.

13. A flexible printed circuit comprising:
    an electrode unit including a force electrode configured to sense a force of a touch input;
    a main circuit unit located on a side of the electrode unit;
    a connection unit folded in a direction while connecting the electrode unit and the main circuit unit; and
    a signal input unit connected to the other side of the electrode unit or to the main circuit unit,
    wherein each of the main circuit unit, the connection unit and the signal input unit all includes a metal layer which is disposed at a same layer where the force electrode is disposed, and
    wherein at least a portion of the main circuit unit overlaps with the electrode unit.

14. The flexible printed circuit according to claim 13, wherein the signal input unit is connected to the other side of the electrode unit and folded in a direction.

15. The flexible printed circuit according to claim 14, wherein the connection unit is folded in a direction toward an upper surface of the electrode unit, and the signal input unit is folded in a direction toward a lower surface of the electrode unit.

16. The flexible printed circuit according to claim 13, wherein the signal input unit is connected to the main circuit unit and folded in a direction as being connected to a lateral surface of the main circuit unit opposite to a lateral surface where the main circuit unit and the electrode unit are connected.

17. The flexible printed circuit according to claim 13, wherein the connection unit connects the electrode unit and the main circuit unit at a plurality of points on a side of the electrode unit.

* * * * *